United States Patent
Nagaraj

(10) Patent No.: US 6,232,898 B1
(45) Date of Patent: May 15, 2001

(54) DIGITAL SELF-CALIBRATION SCHEME FOR A PIPELINED A/D CONVERTER

(75) Inventor: Krishnaswamy Nagaraj, Somerville, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/691,613

(22) Filed: Oct. 18, 2000

Related U.S. Application Data

(62) Division of application No. 09/232,152, filed on Jan. 15, 1999
(60) Provisional application No. 60/071,563, filed on Jan. 15, 1998.

(51) Int. Cl.$^7$ ............... H03M 1/06; H03M 1/10
(52) U.S. Cl. ...................... 341/120; 341/118
(58) Field of Search ..................... 341/120, 118, 341/143, 155, 156, 161, 162

(56) References Cited

U.S. PATENT DOCUMENTS

| 3,653,037 | * | 3/1972 | Utley | 341/120 |
| 5,465,092 | * | 11/1995 | Mayes et al. | 341/118 |
| 5,499,027 | * | 3/1996 | Karanicolas et al. | 341/120 |
| 5,510,789 | * | 4/1996 | Lee | 341/120 |
| 5,594,445 | * | 1/1997 | Ginetti | 341/162 |
| 5,635,937 | * | 6/1997 | Lim et al. | 341/161 |
| 5,771,012 | * | 6/1998 | Shu et al. | 341/118 |
| 5,784,016 | * | 7/1998 | Nagaraj | 341/161 X |
| 6,028,546 | * | 2/2000 | Signell et al. | 341/161 |

\* cited by examiner

*Primary Examiner*—Patrick Wamsley
(74) *Attorney, Agent, or Firm*—Dwight N. Holmbo; Wade James Brady, III; Frederick J. Telecky, Jr.

(57) ABSTRACT

A digital self calibration scheme for pipelined AD converters. The scheme can correct for capacitor mismatch, capacitor non-linearity, amplifier gain and amplifier non-linearity.

23 Claims, 3 Drawing Sheets

DIGITAL SELF-CALIBRATION SCHEME FOR A PIPELINED A/D CONVERTER

This is a Divisional Application of Ser. No. 09/232,152, filed Jan. 15, 1999, which claims benefit of provisional application Ser. No. 60/071,563, filed Jan. 15, 1998.

BACKGROUND AND SUMMARY OF THE INVENTION

The present invention relates to digital self-calibration schemes for pipelined A/D converters.

Background: Analog to Digital Conversion

Analog to digital conversion is the process of converting an analog data signal, which is most commonly represented as voltage, into a digital format. Determining a digital value which represents a particular analog input is known as "quantization". Serial, delta-sigma or oversampling, parallel, and pipelined are some of the many different analog to digital conversion architectures which exist. Different architectures are suited to different needs.

Serial analog to digital architecture offers the widest range of performance in analog to digital conversion, from low power and low resolution to quantizations with very high resolutions. Serial architecture quantizes analog data at the rate of one bit per cycle. Therefore, a digital sample having N bits of resolution will take N cycles to fully quantize. Delta-sigma analog to digital architecture is used in audio signal processing. The architecture is designed to translate high-speed, low-resolution samples into higher-resolution, lower-speed output. This process is also referred to as oversampling because more samples of the analog data are quantized than actually become output. Parallel analog to digital architecture provides the fastest quantization rate per analog signal. In the parallel architecture, a digital value per cycle is produced for each analog data sample, without regard to N, the number of bits of resolution. Parallel architecture requires that all quantization levels be simultaneously compared to the analog signal. This results in the use of $2N-1$ comparators and $2N+1$ resistors to achieve a digital value, with N bits of resolution, per cycle.

Background: Pipelined Analog to Digital Architecture

Pipelined analog to digital architecture, like serial analog to digital architecture, is a method of quantizing an analog signal in stages. Algorithms exist for obtaining either 1 or 1.5 bits of resolution per stage. In a 1.5-bit per stage converter, the digital output of each stage is either 1, 0, or −1. In a 1-bit per stage converter, the digital output of each stage is either 1 or −1. For either algorithm, N stages are required for an N-bit digital value. One bit is resolved at each stage with the result and analog signal sample passed along to the next stage for resolution of another bit. Producing a single digital value for a single analog input requires N cycles, one for each stage. However, the pipelining permits a high degree of parallelism, so that one output per cycle can be produced after the pipeline fills up.

Pipelined analog to digital converters have many applications. They are particularly useful when low voltage, high speed, high resolution quantization is required. The pipelined analog to digital conversion architecture's ability to meet these demands makes it ideal for high volume telecommunications application such as various digital subscriber lines, digital signal processing at video rates, and for stand alone high speed analog to digital converters.

The advantage of pipelined analog to digital conversion is that each stage of resolution is separated. Once the analog signal is resolved at the first stage and the result passed to the second stage, a new signal can be processed by the first stage. The passing of result and signal from stage to stage continues to stage N at which point a digital value of N bits of resolution can be produced. Quantization of the first signal to N bits of resolution is achieved in N cycles. However, because each stage resolves one bit and passes the result to the next stage, the former stage is free to resolve a bit of the next analog sample.

This staged design allows N analog samples to be in the process of quantization simultaneously. Once the first analog sample is quantized, after N cycles, each successive analog sample is quantized one cycle later. Thus, there is only one cycle delay per digitized signal after the first is fully quantized. Pipelined analog to digital conversion therefore results in the fastest throughput rate of any analog to digital conversion that quantizes one-bit per conversion cycle, as it is capable, after an $N-1$ cycles start up period, of quantizing one sample per cycle.

Background: Analog to Digital Conversion Error

Errors can be introduced into the conversion process at different stages and by different components. Two of the most common components in analog to digital conversion which can cause error are capacitors and amplifiers. Capacitors can introduce error because of a mismatch concerning the capacitance ratio of two capacitors or due to a capacitor's non-linearity over a given voltage range. Amplifiers can introduce error by way of gain error, that is, a fixed difference of output versus input. Amplifiers can also introduce error through non-linearity. Non-linearity is characterized by a change in the amplifier's gain as the output gets higher. Non-linearity can be depicted graphically as the deviation from a straight line from the plot of output versus input.

Background: Capacitor Mismatch and Non-linearity

A digital self-calibration technique for pipelined analog to digital converters which corrects for capacitor mismatch has been disclosed in Hae-Seung Lee, A 12-B 600 KS/S DIGITALLY SELF-CALIBRATED PIPELINED ALGORITHMIC ADC, IEEE Journal of Solid State Circuits, Vol 29, No. 4, April 1994, at 509, which is incorporated herein by reference. This article demonstrates the necessary steps for determining the mismatch ratio of two nominally equal capacitors. The difference of the capacitance between two nominally equal capacitors, $C_1$ and $C_2$, can be represented as $C_1 = (1+\alpha_i)C_2$ where $\alpha_i$ represents the mismatch ratio in capacitance between capacitors $C_1$ and $C_2$. Once $\alpha_i$ is known, the error due to capacitance mismatch can be canceled by adding a digital correction quantity:

$$\frac{\alpha_i}{2^i}[(D(i)/2^i - D(i+1)/2^{i+1} - D(i+2)/2^{i+2} - \ldots]$$

to the digital output, where D(i) represents the digital output of the ith stage of a pipelined analog to digital converter.

In the Lee article, several assumptions are made concerning the need for digital self-calibration and the extent to which error should be corrected. The article assumed that the only linearity error present in a 1.5 bits per stage converter is caused by capacitor mismatch. This assumption was based on the presence of an operational amplifier at each stage of the pipeline with "high enough" gain to effectively eliminate the amplifier gain and non-linearity. In other words, the article assumes an amplifier with infinite gain. However, such an amplifier is merely theoretical. Further, an amplifier with a "high enough" gain is costly to produce (especially in low voltage designs) in terms of monetary cost, power consumption and area requirement. Requiring such an operational amplifier for each stage of the pipeline would increase the cost of the converter significantly. Further, higher bit resolutions will require amplifiers with higher gain. Higher gain creates a larger output swing which can cause slew rate and phase margin degradation.

Background: Amplifier Gain and Non-linearity

If the gain error of an amplifier is fixed, it can then be corrected in a fashion similar to the capacitor error correction technique described by Lee. This would require designing an amplifier with constant gain over its entire input signal range. This would allow an error correction constant to be applied to the digital output of the pipelined analog to digital converter to correct for amplifier gain errors. However, such an amplifier design is difficult and costly to implement. For example, an amplifier with a 60 dB raw gain would have to have a constant gain within 10% across the entire signal range in order for a single amplifier gain correction constant to be used with a 14-bit analog to digital conversion.

Correction schemes in the analog domain have been described by Hester, Tan, et al. in various issues of the IEEE Journal of Solid-State Circuits, cited below. Such analog calibration schemes generally require a calibration digital-to-analog converter for each stage. Such a configuration increases the complexity, cost, and size of the converter and the capacitive loading on the operation amplifier. The capacitor arrays generally used to implement such schemes also have the effect of slowing down the circuit's response time.

A digital self-calibration technique for correction of capacitor mismatch errors in pipelined analog to digital converters is known. However, a similar method for correction of amplifier errors is not. Further, a method which combines both capacitor and amplifier error correction into a digital self-calibration technique is not known.

Innovative Structures and Methods

The present application discloses a digital self-calibration method for pipelined analog to digital converters which demonstrates that the errors introduced by capacitor mismatch, capacitor non-linearity, amplifier gain, and amplifier non-linearity can be effectively eliminated at the same time. This elimination of error takes place at conversion of the analog signal such that the output of the analog to digital conversion process is a corrected and highly accurate digital representation.

An advantage of the disclosure is that four major sources of error in analog to digital conversion are accounted for and corrected at one time. This allows for faster and more accurate digital representations of analog data. Another advantage of the present disclosure is that once error values are established for the converter, the calibration scheme needs no outside data to eliminate the error. Another advantage of the present disclosure is that the self-calibration of each stage can be performed without having to calibrate the other stages, this eliminates accumulation of errors in the correction terms. Another advantage of the present disclosure is that the self-calibration can be scaled to account more or fewer bits of precision in the digital output.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Calibration for Amplifier and Capacitor Error

Calibrating for amplifier gain and non-linearity error can be achieved by taking the variable gain variation of the amplifier into account in digitally correcting the signal. This is a far less costly way of calibration when compared to designing an amplifier with constant gain over its entire input signal range.

The digital self-calibration scheme accomplishes error correction by subtracting the total error resulting from capacitor mismatch and non-linearity and amplifier gain and non-linearity which can occur in each stage of the pipeline. As demonstrated by Lee above, capacitor mismatch can be measured for each stage of the pipeline by determining the mismatch ratio for the nominally equal capacitors, $C_1$ and $C_2$ in each stage, i, of the pipeline. This mismatch ratio is represented as $\alpha_i$.

As described below, amplifier gain and non-linearity can be measured by digitally sampling the gain of the amplifier in each stage of the pipeline. Using a resistor network, the gain is sampled over a number of segments which cover the entire input range of the amplifier. The input voltage is subtracted from the digital sample to produce $A_i$, the gain error for a given stage, i, of the pipeline. The total error, for both capacitor mismatch and nonlinearity and amplifier gain and nonlinearity, for the ith stage of the pipeline is represented as:

$$V'_{err}(i) = \left(\alpha_i - \frac{4}{A_i}\right)V_{in}(i) - \left(\alpha_i - \frac{2}{A_i}\right)D_i V_R$$

The error terms can be reduced to:

$$V_{err}(i) = \beta_i V_{in}(i) - \gamma_i D_i V_R$$

$\beta_i$ and $\gamma_i$ are calculated for each stage, i, of the pipeline. These values are stored in a memory array.

Once the pipeline produces a digital result, the error values associated with the result can be referenced from the array. The error for each stage of the pipeline is then totaled and subtracted from the digital result of the pipeline to produce a corrected digital output.

Figure 4:
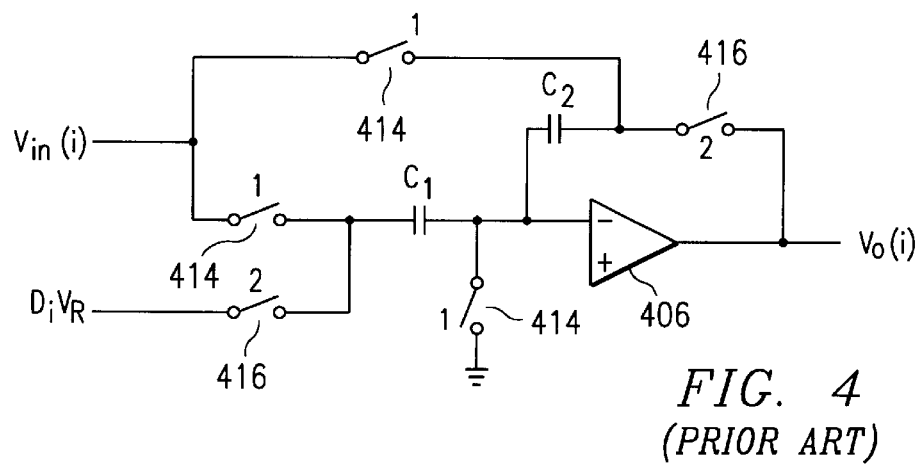
FIG. 4 illustrates the ith stage of a conventional 1.5 bits per stage pipelined analog to digital converter.

FIG. 4 illustrates the ith stage of a conventional 1.5 bits per stage pipelined analog to digital converter. Each stage of a pipelined analog to digital converter consists of two nominally equal capacitors, $C_1$ and $C_2$, and an operational amplifier 406.

The ith stage operates in two phases. $V_{in}(i)$ is the input voltage as to stage i. $V_R$ represents the reference voltage sample that is being quantized in the pipelined analog to digital converter. In the first phase, $V_{in}(i)$ is compared with two levels, $V_+(0<$ $V_+<V_R/2)$ and $V_-(-V_R/2<V_-<0)$. Digital output D(i) is produced according to:

$$D(i) = \begin{cases} = 1 \text{ if } V_{in}(i) > V_+ \\ = 0 \text{ if } V_- < V_{in}(i) < V_+ \\ = -1 \text{ if } V_{in}(i) < -V_- \end{cases}$$

In the second phase, $V_o(i)$, the voltage output of stage i which is to be passed as $V_{in}(i+1)$ to stage i+1 is produced. $V_o(i)$ is represented as $2V_{in}(i)-D(i)V_R$.

The circuit comprising the ith stage is designed with switched capacitor architecture, although a dc loop or other design could be used. In the first phase, switches 414 are turned on and switches 416 are turned off, connecting the operational amplifier 406 in unity gain mode. This allows sampling of the voltage $V_{in}(i)$ on capacitors $C_1$ and $C_2$. In the second phase, switches 414 are turned off and switches 416 are turned on. Ignoring charge rejection, $V_o(i)$ is represented as $2V_{in}(i)-D(i)V_R$.

When capacitor mismatch and amplifier gain error are taken into consideration, $V_o(i)$ is represented as $$V_0(i) = 2\left(1 - \frac{2}{A_1}\right)\left(1 + \frac{\alpha_i}{2}\right)V_{in}(i) - \left(1 - \frac{2}{A_i}\right)(1 + \alpha_1)D_1 V_R$$

where amplifier gain is represented as $A_i$. The error of $V_o(i)$ can then be represented as
If we define $$V_{err}(i) = \left(\alpha_i - \frac{4}{A_i}\right)V_{in}(i) - \left(\alpha_i - \frac{2}{A_i}\right)D_i V_R$$

$$\beta_i = \left(\alpha_i - \frac{4}{A_i}\right)$$

and $$\gamma_i = \left(\alpha_i - \frac{2}{A_i}\right)$$

then $V_{err}(i)$ can be represented as $$V_{err}(i) = \beta_i V_{in}(i) - \gamma_i D_i V_R$$

The error in $V_o(i)$ can be approximated digitally by:

$$DV_{err}(i) = \beta_i DV_{in}(i) - \gamma_i D_i$$

$$= \beta_i \left(\frac{D_i}{2} + \frac{D_{i+1}}{2^2} + \frac{D_{i+2}}{2^3} + \ldots\right) - \gamma_i D_i$$

where $DV_{in}(i)$ is a digital approximation of $V_{in}(i)$. The digital approximation of the error eliminates $V_R$ as it is a normalizing factor. While this calculation includes error, in that it is only a digital approximation, it is assumed to be a perfect digital representation of $V_{in}(i)$ for the purposes of calculating $DV_{err}(i)$. The digital approximation of $V_{in}(i)$ is calculated using the digital results of successive stages of the pipelined analog to digital converter.

Figure 7:
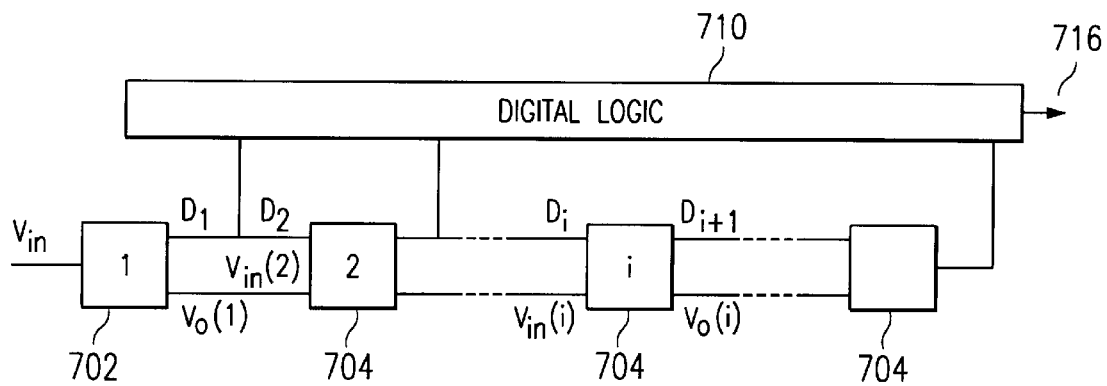
FIG. 7 schematically depicts a 1.5 bits per stage pipelined analog to digital converter.

FIG. 7 schematically depicts a 1.5 bits per stage pipelined analog to digital converter. Each stage 702 and 704 resolves one bit of the digital approximation of $V_{in}$. The first stage 702 accepts the sampled voltage, $V_{in}$, as input and produces a digital output of 1 bit and an output voltage, $V_o(1)$. $V_o(1)$ becomes $V_{in}(2)$ for the next stage 704 of the converter. The digital output, $D_1$, becomes the digital input $D_2$ for the next stage of the converter 704. The digital output of each stage is also input to the digital logic unit 710 for output of the self-calibrated digital approximation of the input voltage 716. The second and successive stages of the converter accept as input both $V_{in}(i)$ and $D_i$ and have as their output $V_o(i)$ for the next stage and $D_i$ for the digital logic unit and the next stage, i+1. The last stage of the pipelined converter has only $D_i$ as its output as a $V_o(i)$ is not necessary.

Calculating Total Error

The error introduced in each stage of the pipelined analog to digital converter can be numbered starting with the most significant bit stage. This yields the following input referred error terms $$DV_{err}(1) = \beta_1\left(\frac{D_1}{2} + \frac{D_2}{2^2} + \frac{D_3}{2^3} + \ldots\right) - \gamma_1 D_1$$

$$DV_{err}(2) = \frac{\beta_2}{2}\left(\frac{D_2}{2} + \frac{D_3}{2^2} + \frac{D_4}{2^2} + \ldots\right) - \gamma_2 D_2$$

$$DV_{err}(3) = \frac{\beta_3}{2^2}\left(\frac{D_3}{2} + \frac{D_4}{2^2} + \frac{D_5}{2^2} + \ldots\right) - \gamma_3 D_3$$

Alternatively, we can define error for each bit of the conversion, again numbering from the most significant bit stage, as:

$$err(D_1) = \left(\frac{\beta_1}{2} - \gamma_1\right)$$

$$err(D_2) = \left(\frac{\beta_1 + \beta_2}{2^2} - \frac{\gamma_2}{2}\right)$$

-continued $$err(D_3) = \left(\frac{\beta_1 + \beta_2 + \beta_3}{2^3} - \frac{\gamma_3}{2^2}\right)$$

$$err(D_k) = \left(\frac{\beta_1 + \beta_2 + \beta_3 + \ldots \beta_k}{s^k} - \frac{\gamma_k}{2^{k-1}}\right)$$

The total error for the output of the analog to digital converter is represented by:

TOTAL ERROR=$D_1 err(D_1)+D_2 err(D_2)+D_3 err(D_3)\ldots$

Therefore, by digitally subtracting this error, we can cancel the error due to capacitor mismatch and amplifier gain and non-linearity.

Amplifier Gain and Non-linearity Errors

Figure 2A:
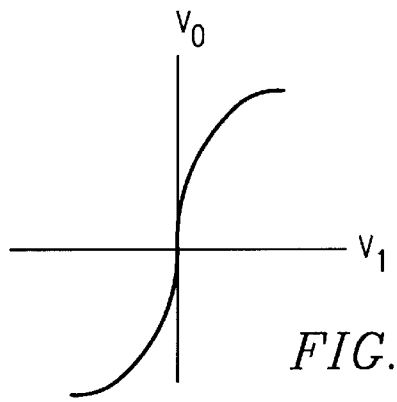
FIG. 2A represents the voltage input range V(i) applied to the ith stage of a pipelined analog to digital converter.
Figure 2B:
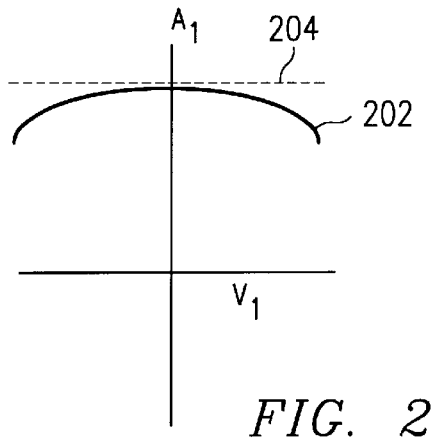
FIG. 2B represents the amplifier gain for an operational amplifier in the ith stage a pipelined analog to digital converter over the input voltage range V(i).

Unlike digital errors due to capacitor mismatch, errors introduced by amplifiers are not constant across the input range for a given amplifier. The values of $\beta_i$ and $\gamma_i$ as described above are dependent on $V_o(i)$, the input signal at stage i. FIG. 2A represents the voltage input range V(i) applied to the ith stage of a pipelined analog to digital converter. In FIG. 2B, the solid line 202 represents amplifier gain $A_i$ for an operational amplifier 416 in the ith stage of the same pipelined analog to digital converter over the given input voltage range V(i). The dashed line 204 represents the output of a theoretical operational amplifier with constant gain over the same voltage input V(i).

Figure 3:
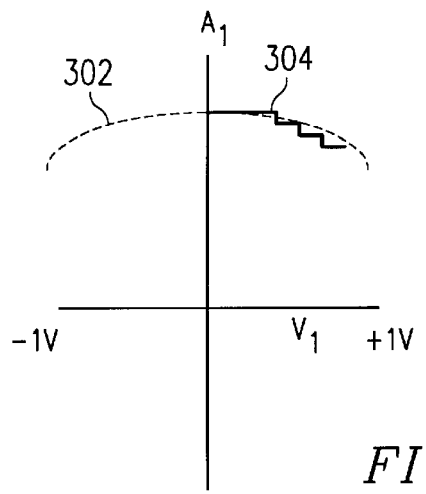
FIG. 3 graphically represents a digital calibration strategy for correcting amplifier gain and non-linearity.

FIG. 3 graphically represents a digital calibration strategy for correcting amplifier gain and non-linearity. In FIG. 3, the amplifier's gain $A_i$ over the input voltage V(i) is represented as a dashed line 302. The solid line 304 defines a digital approximation of the amplifier's gain. The precision of this piecewise linear approximation increases with the number of segments sampled at each stage. A sample of 4 segments provides for adequate precision in a 14-bit conversion. Two bits of resolution provides for four segments of piecewise approximation of the amplifier's gain over V(i), the range that will be the input to the ith stage of a pipelined analog to digital converter. This piecewise strategy is followed for each stage of the pipelined analog to digital converter as each stage has a separate operational amplifier with separate gain and linearity characteristics.

Measurement of Amplifier Gain Error

Figure 1:
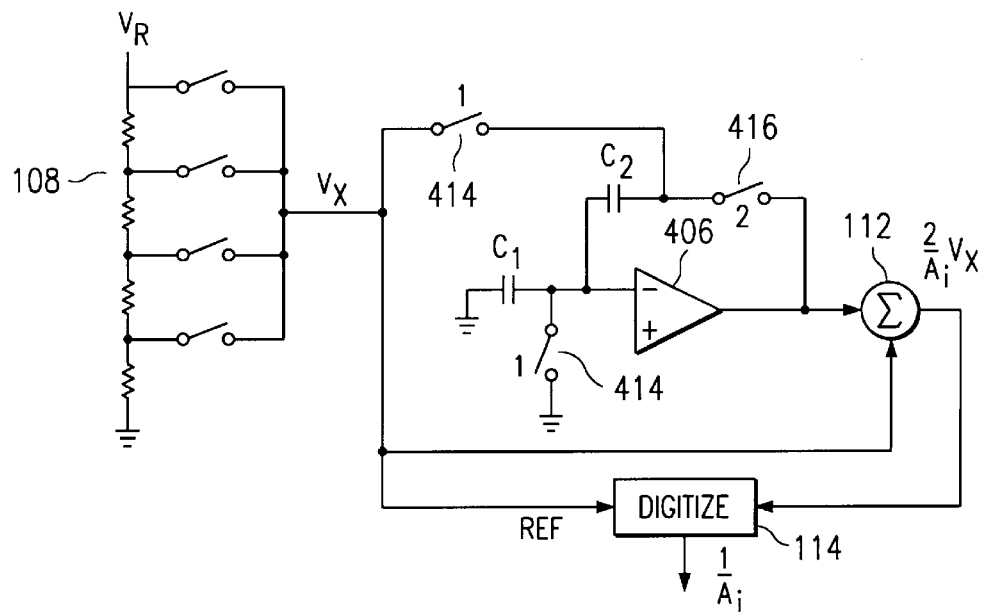
FIG. 1 illustrates the circuit of FIG. 4 configured to calculate gain error at various segments of an input voltage range V(i).

FIG. 1 illustrates the circuit of FIG. 4 configured to measure gain error at various segments of an input voltage range V(i). Voltage $V_x$ is representative of a possible input voltage for a particular segment of the ith stage amplifier. The resistor network 108, is representative of the manner in which an input reference voltage, $V_R$, is divided into the number of segments desired for gain error measurement.

The measurement is produced in two phases. In phase one, switches 414 are turned on and switches 416 are turned off, connecting the operational amplifier 416 in unity gain mode. This allows sampling of $V_x$ on capacitors $C_1$ and $C_2$. In phase two, switches 414 are turned off and switches 416 are turned on. The produces voltage $V_x$ plus any gain error introduced by the operational amplifier function. This amplifier output is summed 112 with the original voltage $V_x$ yielding, $2V_x/A_i$ or, two times the voltage modified by any amplifier gain error. This result is digitized 114 using voltage $V_x$ as a reference. Therefore $V_x$ is cancelled, yielding the amplifier gain error for the given segment, represented as $1/A_i$. This process is repeated for each segment, utilizing the resistor network 108 to introduce a voltage $V_x$ representative of a voltage within the segment. The entire process is repeated for each stage of the pipelined analog to digital conversion.

Figure 5:
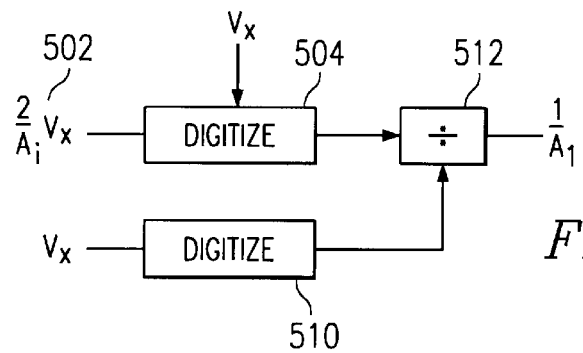
FIG. 5 illustrates an alternative method for calculating amplifier gain.

Alternatively, as represented by FIG. 5, once the input voltage $V_x$ has been multiplied by two and modified by any operational amplifier gain error 502, the result can be digitized 504 with the original $V_x$ subtracted out yielding $V_x/A_i$. In a separate phase, the input voltage $V_x$ can be digitized 510. $V_x$ can then be divided 512 out of $V_x/A_i$ yielding $1/A_i$ 514, the amplifier gain error for the given segment.

Using either method, once $1/A_i$ is known, the values $\beta_i$ and $\gamma_i$ can be calculated not only for a particular stage, i, of the pipelined analog to digital converter but also for segments within each stage according to:

$$err(D_1) = \left(\frac{\beta_1}{2} - \gamma_1\right)$$

$$err(D_2) = \left(\frac{\beta_1 + \beta_2}{2} - \frac{\gamma_2}{2}\right)$$

$$err(D_3) = \left(\frac{\beta_1 + \beta_2 + \beta_3}{2^2} - \frac{\gamma_3}{2^2}\right)$$

$$err(D_k) = \left(\frac{\beta_1 + \beta_2 + \beta_3 + \ldots \beta_k}{s^k} - \frac{\gamma_k}{2^{k-1}}\right)$$

The values for each segment in a stage can be represented as $\beta_{ij}$ and $\gamma_{ij}$ where i represents the current stage of the pipelined analog to digital converter and j represents the amplifier gain segment within the ith stage.

Such a piecewise approximation of amplifier gain error, while possible, is not necessary for each stage of the pipelined analog to digital converter. Typically, for amplifier non-linearity correction, only the first three stages, counting from the most significant bit stage, need to be corrected by segments. Further, for 14-bit precision, only around 6 stages of the pipelined analog to digital converter need be corrected for amplifier non-linearity at all. Of those six stages, only the first three need to rely on the piecewise approximation method of amplifier error correction. Stages four through six can rely on a fixed correction for each amplifier gain stage without having to perform further segmented gain correction. This correction value can be calculated as described with the piecewise approximation gain correction but requires only one measurement of the amplifier gain.

Therefore, the calibration for amplifier non-linearity can be represented by:

$$err(D_1) = \frac{\beta_1}{2} - \gamma_1 D_1$$

$$err(D_2) = \frac{\beta_1 + \beta_2}{2^2} - \frac{\gamma_2}{2}$$

$$err(D_3) = \frac{\beta_1 + \beta_2 + \beta_3}{2^3} - \frac{\gamma_3}{2_2}$$

$$err(D_4) = \frac{\beta_1 + \beta_2 + \beta_3}{2^4} + \frac{\beta_4}{2^4} - \frac{\gamma_4}{2^3}$$

$$= \frac{\beta_1 + \beta_2 + \beta_3}{2^4} + ferr(D_4)$$

Where k>4, $$err(D_k) = \frac{\beta_1 + \beta_2 + \beta_3}{2^k} + ferr(D_k)$$

with $$ferr(D_k) = \frac{\beta_k}{2^k} - \frac{\gamma_k}{2^{k-1}} + ferr(D_{k-1})$$

ferr represents a fixed error for each stage used to calibrate the converter.

Figure 6:
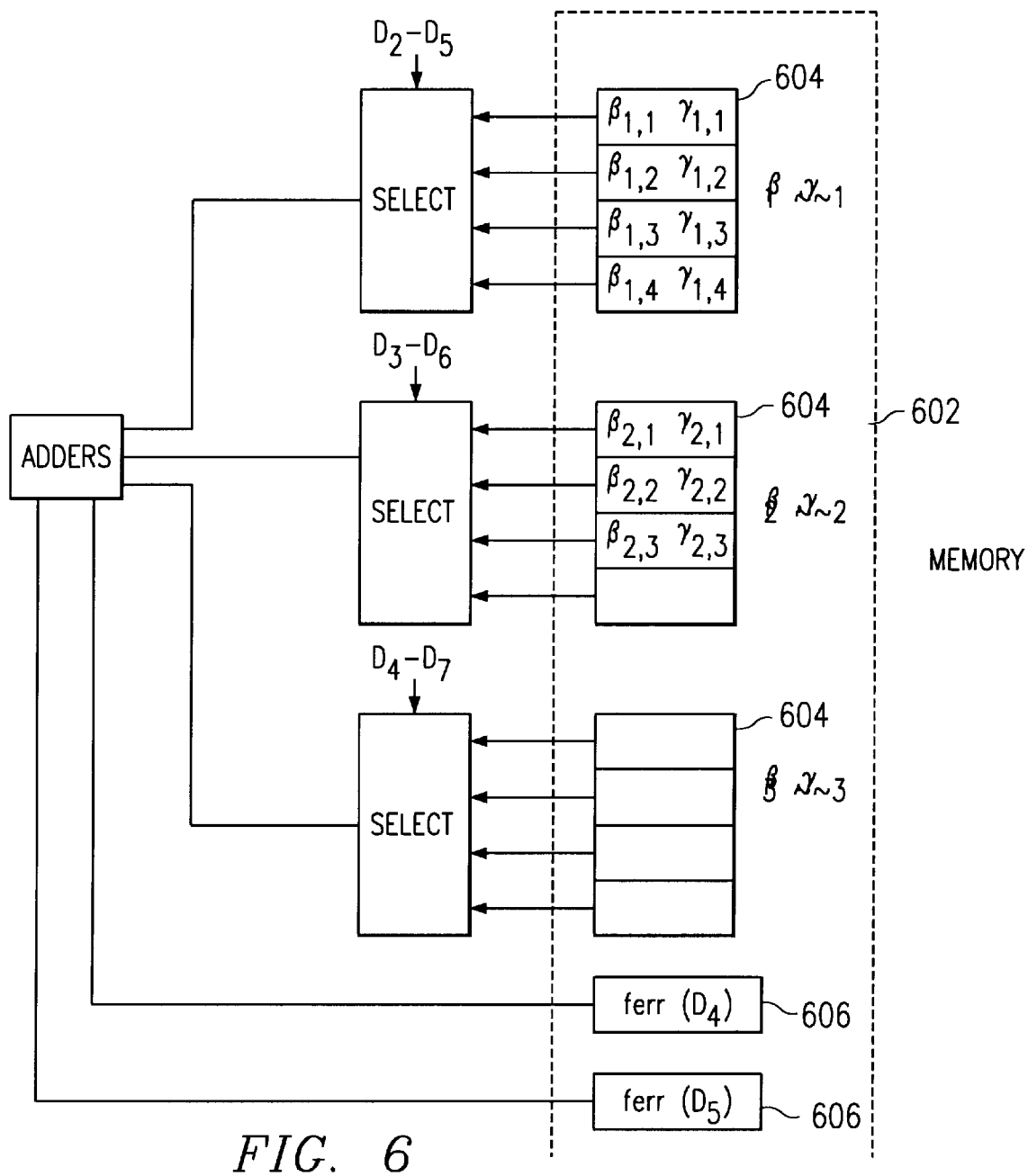
FIG. 6 represents the preferred implementation method of the digital self-calibration technique.

FIG. 6 represents the preferred implementation method of the digital self-calibration scheme. The values for $\beta_{ij}$ and $\gamma_{ij}$ where i=1 to the number of stages of the pipelined analog to digital converter that are to be calibrated through piecewise approximation and j=1 to the number of segments of amplifier gain approximation desired per stage, are stored in non-volatile memory 602 as they are calculated. For each i, the corresponding j values are stored in a two-dimensional array 604 containing both $\beta$ and $\gamma$ values. For pipelined stages beyond i but still within the stages that are to be corrected for amplifier non-linearity, approximately 6 for a 14-bit resolution converter, a single correction factor 606 is calculated and stored.

To apply the proper $\beta_i$ and $\gamma_i$, the digital output of stages i+1 to i+x, where x=the number of bits of precision used in the piecewise approximation amplifier gain correction calculation, is used to reference the proper row of the matrix corresponding to $\beta_i$ and $\gamma_i$. E.g., if eight segments were used, x would need to be three, ($2^3$=8) and if i=1; $D_2$=1; $D_3$=0; and $D_4$=0, the values of $\beta_{1,4}$ and $\gamma_{1,4}$ would be substituted in the error correcting equations for $\beta_1$ and $\gamma_1$ The same process would be followed for the successive stages of the converter which are to be corrected through the piecewise approximation method, i.e. for i=2, $D_{3-5}$would be used to reference the error correction values, etc. For stages beyond piecewise approximation error correction, a single memory element is referenced, e.g., ferr($D_4$) for stage 4.

In an alternative embodiment, all possible values for all possible error terms are computed and stored in a non-volatile memory array. The appropriate error term is selected using the bits of the output of the pipelined analog to digital converter as addresses. While this requires a large number of initial computations and a large amount of hardware non-volatile memory space, it results in faster corrected output as only one addition operation per error term is required.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the piecewise approximation approach described for correction of amplifier gain and non-linearity errors can be applied to correct for capacitor non-linearity errors as well. Capacitor non-linearity is extremely difficult to determine and is usually measured, if at all, at manufacture time or derived from a device model. Once a capacitor's non-linearity has been determined over a given number of segments, $\alpha_{ij}$, a look-up table, like the array 604 used to store the values for $\beta_{ij}$ and $\gamma_{ij}$, can be referenced to provide $\alpha_i$ values for the determination of $\beta_i$ and $\gamma_i$.

For another example, capacitor mismatch and amplifier gain errors are usually of such a minute degree that they do not manifest themselves until resolutions of more than 8 bits are attempted. Thus, for a 14-bit converter, preferably 6 bits or stages of the pipeline are corrected. However, a greater or fewer number of bits or stages can alternatively be corrected using this technique.

For another example, amplifier non-linearity errors typically do not manifest themselves until resolutions of more than 11 or 12 bits are attempted. Thus, for a 14-bit converter, 3 or more stages of the pipeline must be corrected. However, a greater or fewer number of bits or stages could be corrected using this technique.

For another example, a 1-bit per stage converter can also make use of this self-calibration technique.

For another example, other analog to digital conversion architectures, such as one-stage recycling converters can also make use of this self-calibration technique.

For another example, the digital self-correction technique described can be used in combination with analog self-correction techniques.

Further details of the system context and of options for implementation may be found in Michael J. Demler, HIGH-SPEED ANALOG-TO-DIGITAL CONVERSION (1991); Analog Devices, Inc., ANALOG-DIGITAL CONVERSION HANDBOOK (1986);and Behzad Razavi, PRINCIPLES OF DATA CONVERSION SYSTEM DESIGN (1995); IEEE Journal of Solid-State Circuits April 1994, A 12-B 600 KS/S DIGITALLY SELF-CALIBRATED PIPELINED ALGORITHMIC ADC 509; IEEE Journal of Solid-State Circuits February 1990 FULLY DIFFERENTIAL ADC WITH RAIL-TO-RAIL COMMON-MODE RANGE AND NONLINEAR CAPACITOR COMPENSATION 173; IEEE Journal of Solid-State Circuits April 1993 A LOW-POWER 12-B ANALOG-TO DIGITAL CONVERTER WITH ON-CHIP PRECISION TRIMMING 455; and IEEE Journal of Solid-State Circuits December 1990 ERROR CORRECTION TECHNIQUES FOR HIGH-PERFORMANCE DIFFERENTIAL A/D CONVERTERS 1318; all of which are hereby incorporated by reference.

What is claimed is:

1. A method for converting analog signals to digital signals, in a converter, comprising the steps of:
    for each stage in said converter, measuring multiple ones of:
        capacitor mismatch ratio;
        capacitor non-linearity;
        amplifier gain; and
        amplifier non-linearity; and
    correcting the output of said converter with error terms which include components compensating for three or more of the following:
        capacitor mismatch ratio;
        capacitor non-linearity;
        amplifier gain; and
        amplifier non-linearity.

2. The method of claim 1 wherein said amplifier gain and said amplifier non-linearity error measuring, comprises the actions of:
    dividing an input voltage range to an operational amplifier into a plurality of segments;
    measuring amplifier gain and non-linearity error present for each segment of said input voltage; and
    using the result obtained to calculate capacitor and amplifier error elements of said voltage segment.

3. The method of claim 2 wherein the number of said segments is at least two for the most significant bit stages, and at least one of the least significant bit stages is not measured.

4. The method of claim 2 wherein the number of said segments is at least two for the most significant bit stages, the number of said segments is one for at least one stage, and at least one of the least significant bit stages is not measured.

5. The method of claim 2 wherein said segment of said input voltage range is achieved using a resistor network.

6. The method of claim 1 wherein said converter is a pipelined converter.

7. The method of claim 1 wherein said capacitor mismatch error is measured for the most significant bit stages, but not for at least one of the least significant bit stages.

8. The method of claim 1 wherein said amplifier gain and said amplifier non-linearity error is measured for the most significant bit stages, but not for at least one of the least significant bit stages.

9. The method of claim 1 wherein said error terms are stored in non-volatile random access memory.

10. A method for converting analog signals to digital signals, in a converter, comprising the steps of:
    (a.) for each stage in said converter:
        (i.) measuring capacitor mismatch ratio;
        (ii.) measuring amplifier gain and non-linearity error;
        (iii.) using the results obtained in steps (i.) and (ii.) to calculate capacitor and amplifier error elements; and
        (iv.) storing said capacitor and amplifier error elements;
    (b.) referencing said capacitor and amplifier error elements for a given input signal value to produce an error value for each stage;
    (c.) multiplying said error value for each stage by the result of step (b.);
    (d.) respectively summing the results of step (c.) to produce total error; and
    (e.) subtracting said total error from the digital output of said converter.

11. The method of claim 10 wherein said amplifier gain and non-linearity error measuring, comprises the actions of:
    dividing an input voltage range to an operational amplifier into a plurality of segments;
    measuring amplifier gain and non-linearity error present for each segment of said input voltage; and
    using the result obtained to calculate capacitor and amplifier error elements of said voltage segment.

12. The method of claim 11 wherein the number of said segments is at least two for the most significant bit stages, and at least one of the least significant bit stages is not measured.

13. The method of claim 11 wherein the number of said segments is at least two for the most significant bit stages, the number of said segments is one for at least one stage, and at least one of the least significant bit stages is not measured.

14. The method of claim 11 wherein said segment of said input voltage range is achieved using a resistor network.

15. The method of claim 10 wherein said converter is a pipelined converter.

16. The method of claim 10 wherein said capacitor mismatch error is measured for the most significant bit stages, but not for at least one of the least significant bit stages.

17. The method of claim 10 wherein said amplifier gain and non-linearity error is measured for the most significant bit stages, but not for at least one of the least significant bit stages.

18. The method of claim 10 wherein said error elements are stored in non-volatile random access memory.

19. A system of analog to digital conversion, comprising:
    (a.) an analog to digital converter with a plurality of stages;
        (i.) the first stage of said plurality of stages having an analog input and an analog output and a digital output;
        (ii.) said successive stages having an analog and a digital input and an analog and a digital output;
    (b.) a non-volatile memory array storing data corresponding to capacitor and amplifier error of each said stage of said converter; and
    (c.) digital logic which performs the actions of:
        (i.) referencing said capacitor and amplifier error elements to produce an error value for a given input signal value for each stage;
        (ii.) multiplying said error value for each stage by the result of step (c.)(i.);
        (iii.) respectively summing the results of step (ii.) to produce total error; and
        (iv.) subtracting said total error from the digital output of said converter.

20. The system of claim 19 wherein only amplifier gain and non-linearity errors are stored and referenced.

21. The system of claim 19 wherein said converter is a pipelines converter.

22. The system of claim 19 wherein said amplifier gain and non-linearity error is referenced and stored for the most significant bit stages but not for at least one of the least significant bit stage.

23. The system of claim 19 wherein said error value is produced for the most significant bit stages, but not for at least one of the least significant bit stages.

* * * * *